US012790195B2

(12) United States Patent
Summerfelt et al.

(10) Patent No.: US 12,790,195 B2
(45) Date of Patent: Nov. 10, 2026

(54) MICROELECTROMECHANICAL DEVICE WITH BEAM STRUCTURE OVER SILICON NITRIDE UNDERCUT

(71) Applicant: Texas Instruments Incorporated, Dallas, TX (US)

(72) Inventors: Scott Robert Summerfelt, Garland, TX (US); Adam Joseph Fruehling, Garland, TX (US); Kelly Jay Taylor, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 79 days.

(21) Appl. No.: 17/320,188

(22) Filed: May 13, 2021

(65) Prior Publication Data

US 2021/0354977 A1 Nov. 18, 2021

Related U.S. Application Data

(60) Provisional application No. 63/024,850, filed on May 14, 2020.

(51) Int. Cl.
*B81B 3/00* (2006.01)

(52) U.S. Cl.
CPC .......... *B81B 3/0021* (2013.01); *B81B 3/0086* (2013.01); *B81B 2203/0118* (2013.01)

(58) Field of Classification Search
CPC ........ B81B 2207/015; B81B 2207/096; B81B 2203/0118; B81B 2201/014; B81C 2203/0735; B81C 1/0015
See application file for complete search history.

(56) References Cited

U.S. PATENT DOCUMENTS

| | | | | |
|---|---|---|---|---|
| 5,399,415 | A * | 3/1995 | Chen | B81C 1/00214 428/209 |
| 8,570,122 | B1 * | 10/2013 | Hammond | B81B 7/0019 335/78 |
| 2004/0022044 | A1 * | 2/2004 | Yasuoka | H01H 59/0009 361/801 |
| 2012/0133006 | A1 * | 5/2012 | Hasselbach | H01G 5/18 257/E29.324 |
| 2013/0043537 | A1 | 2/2013 | Arai et al. | |
| 2013/0062711 | A1 | 3/2013 | Zuniga-Ortiz et al. | |
| 2013/0156993 | A1 * | 6/2013 | Czabaj | B81C 1/00246 216/13 |

(Continued)

FOREIGN PATENT DOCUMENTS

| | | | | |
|---|---|---|---|---|
| CN | 101060027 A | | 10/2007 | |
| WO | WO-2004024618 A1 | * | 3/2004 | B81B 7/007 |

OTHER PUBLICATIONS

PCT International Search Report dated Aug. 19, 2021.

(Continued)

*Primary Examiner* — Steven B Gauthier
*Assistant Examiner* — Sun Mi Kim King
(74) *Attorney, Agent, or Firm* — Zhenhai Fu; Charles F. Koch

(57) ABSTRACT

In described examples, a microelectromechanical system (MEMS) is located on a substrate. A silicon nitride (SiN) layer on a portion of the substrate. A mechanical structure has first and second ends. The first end is embedded in the SiN layer, and the second end is cantilevered from the SiN layer.

19 Claims, 5 Drawing Sheets

(56) References Cited

U.S. PATENT DOCUMENTS

| | | | | |
|---|---|---|---|---|
| 2013/0344280 | A1* | 12/2013 | Boomhower | C22C 5/02 427/404 |
| 2014/0064904 | A1* | 3/2014 | Bibl | B81C 1/0015 216/13 |
| 2014/0308771 | A1* | 10/2014 | Brigham | B81C 1/00047 716/110 |
| 2014/0355381 | A1* | 12/2014 | Lal | G01S 15/02 327/356 |

OTHER PUBLICATIONS

J. Wang, et.al., "A MicroPirani Pressure Sensor Based on the Tungsten Microhotplate in a Standard CMOS Process", IEEE Transactions on Industrial Electronics, vol. 56, No. 4, Apr. 2009, pp. 1086-1091.

James G. Fleming, Seethambal Mani, and Michael Baker, "Novel micromolded structures", Proceedings of SPIE, 4979, Micromachining and Microfabrication Process Tecnology VIII, Jan. 15, 2003, doi:10.1117/12.478243, pp. 456-463.

J.G. Fleming, Michael Baker, and David Luck, "A Novel Latching Relay Fabricated Using an Oxide Molded Tungsten Process", MRS Online Proceedings Library, vol. 872, Article No. 116 (2005), Dec. 1, 2005, pp. 1-6.

Martin Riverola, et al, "High Performance Seesaw Torsional CMOS-MEMS Relay Using Tungsten VIA Layer", Micromachines, v.9, p. 579, 2018, pp. 1-13.

* cited by examiner

MICROELECTROMECHANICAL DEVICE WITH BEAM STRUCTURE OVER SILICON NITRIDE UNDERCUT

CROSS-REFERENCE TO RELATED APPLICATION

This application claims priority to U.S. Provisional Patent Application No. 63/024,850 filed May 14, 2020, the entirety of which is incorporated herein by reference.

TECHNICAL FIELD

This relates to microelectromechanical devices that include a released mechanical structure positioned over an undercut in a silicon nitride layer.

BACKGROUND

Microelectromechanical (MEM) relays can play an important role as a device for adding functionality and decreasing the power consumption for various applications such as sensors and consumable devices for the Internet of things (IoT) and wearables. One type of MEMS device is a mechanical relay. These devices have the capability of a quasi-ideal switching behavior with a very abrupt on-off switching, and zero current leakage during the OFF-state. Multi-terminal operation of relays can also save energy. See, for example, Martin Riverolo, et al, "High Performance Seesaw Torsional CMOS-MEMS Relay Using Tungsten VIA Layer," 2018. A complementary metal oxide semiconductor (CMOS) platform can be used for the monolithic fabrication of such MEMS relays in a combination with classical CMOS devices.

CMOS MEMS is a technology where Al (aluminum) metallization and chemical vapor deposition (CVD) of tungsten (W) in VIA masks are used to create MEMS structures. One characteristic of this approach is that silicon dioxide ($SiO_2$) between metal layers is used as the removable spacer. The $SiO_2$ is typically removed using vapor hydrogen fluoride (HF) or liquid HF. Some CMOS MEMS devices use silicon (Si) (single crystal or polycrystal) as the MEMS removable layer. The Si can be etched with plasma fluorine (F) process or xenon difluoride (XeF2).

SUMMARY

In described examples, a microelectromechanical system (MEMS) is located on a substrate. There is a silicon nitride (SiN) layer on a portion of the substrate. A mechanical structure has first and second ends. The first end is embedded in the SiN layer, and the second end is cantilevered from the SiN layer.

DETAILED DESCRIPTION OF EXAMPLE EMBODIMENTS

Figure 1:
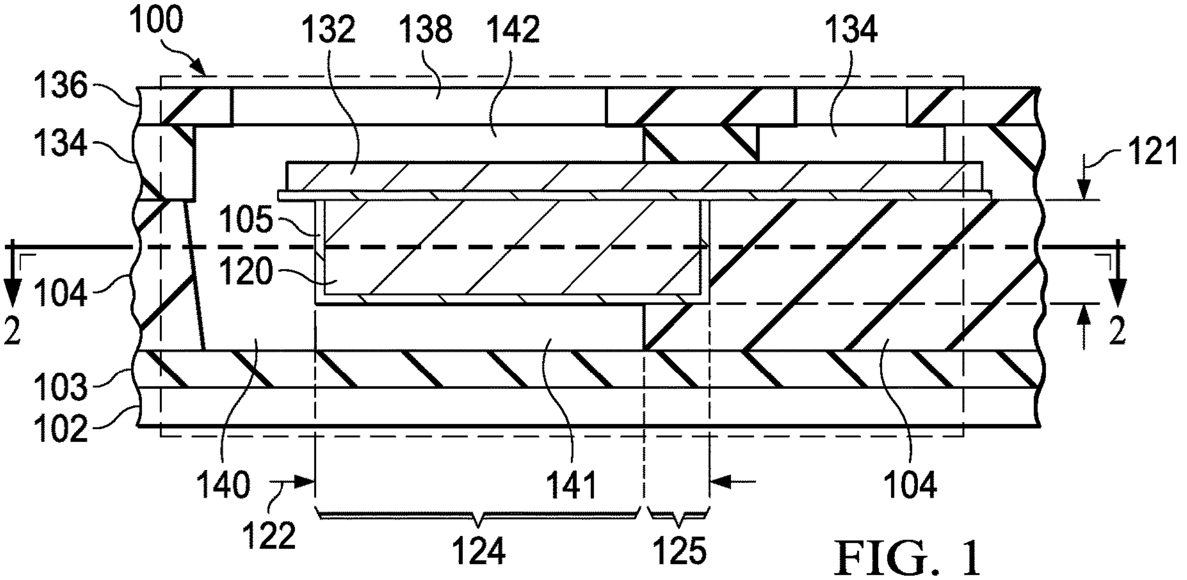
FIG. 1 is a cross sectional view of a portion of an example CMOS integrated circuit chip that includes a MEMS device with a beam formed in a layer of silicon nitride.

In the drawings, like elements are denoted by like reference numerals for consistency.

CMOS MEMS has several characteristics that makes it attractive. CMOS is quite mature, and analog or other circuits can be incorporated on the same wafer as a MEMS device(s). CMOS wafers are relatively inexpensive and can be fabricated with a wide variety of known process technologies.

An issue with fabricating MEMS using an example CMOS process is the silicon dioxide (SiO2) undercut process. Usually, a dielectric layer of SiO2 is formed and then a metallic structure is formed on the layer of SiO2. A wet hydrofluoric (HF) etch that is typically is used to undercut a portion of the SiO2 to release a portion of the metallic structure to form a MEMS device creates a high stress that is limiting for MEMS structure. The HF etch also attacks some of the other materials, like titanium (Ti), that are typically used within CMOS structures. Vapor HF is even more reactive and attacks SiN, which is typically used as a dielectric material. This makes it difficult to create dielectric elements that are part of a MEMS structure.

An example CMOS process also has a limitation in that it may not include materials that are needed for MEMS devices such as relays. Conductive materials that are used in a CMOS process such as W and titanium nitride (TiN) do not create good contacts for MEMS devices, such as relays.

In described examples, CMOS metals (such as: aluminum (Al), Ti, TiN, titanium tungsten alloy (TiW), W, copper (Cu), tantalum (Ta), tantalum nitride (TaN)) may be combined with alternative materials such: as tantalum pentoxide (Ta2O5), titanium dioxide (TiO2), aluminum oxide (Al2O3), titanium aluminum nitride (TiAlN), chromium nitride (CrN), titanium aluminum oxide nitride (TiAlON), molybdenum (Mo), aluminum nitride (AlN), aluminum scandium nitride (AlScN), hafnium zirconium oxide (HfZrOx), platinum (Pt), iridium (Ir), Iridium oxide (IrOx), lead zirconate titanate (Pb(Zr,Ti)O3), lead (Pd), lead oxide (PdO), gold (Au), silver (Ag), nickel iron alloy (NiFe), iron (Fe), cobalt (Co), nickel (Ni), cobalt nickel iron alloys (CoNiFe), ruthenium (Ru), ruthenium oxide (RuO2), etc. which may be useful for creating piezoelectric actuation and/or relay contacts with undercut SiN dielectric.

These alternative materials can be included in a CMOS process by using SiN dielectric layers that are flattened using chemical mechanical polishing (CMP) steps during the fabrication process. This makes it possible to create CMOS using SiN as the dielectric between layers. A plasma process using carbon, fluorine, and oxygen (CxFy+O2) is used to provide selective gas removal of the SiN and yet not attack most of these metals and dielectrics. For example, a plasma carbon tetrafluoride plus oxygen (CF4+O2) provides a strong etch rate for SiN while only weakly etching SiO2. This selectivity applies to most of the other materials although there is some attack of W, Mo, and Ru or RuO2. A downstream plasma with a low substrate bias is used. This process is similar to that used to ash resist. This plasma process etches the SiN in a mostly isotropic fashion. This is a useful characteristic for undercut etch of MEMS structures. This is a completely different etch process compared to VIA etch where a directional etch is needed to produce vias.

In described examples, SiO2 and many other dielectrics such as $Al_2O_3$, Ta2O5, TiO2 can be used to create a dielectric feature that is not strongly attacked by the plasma etch undercut process.

Figure 2:
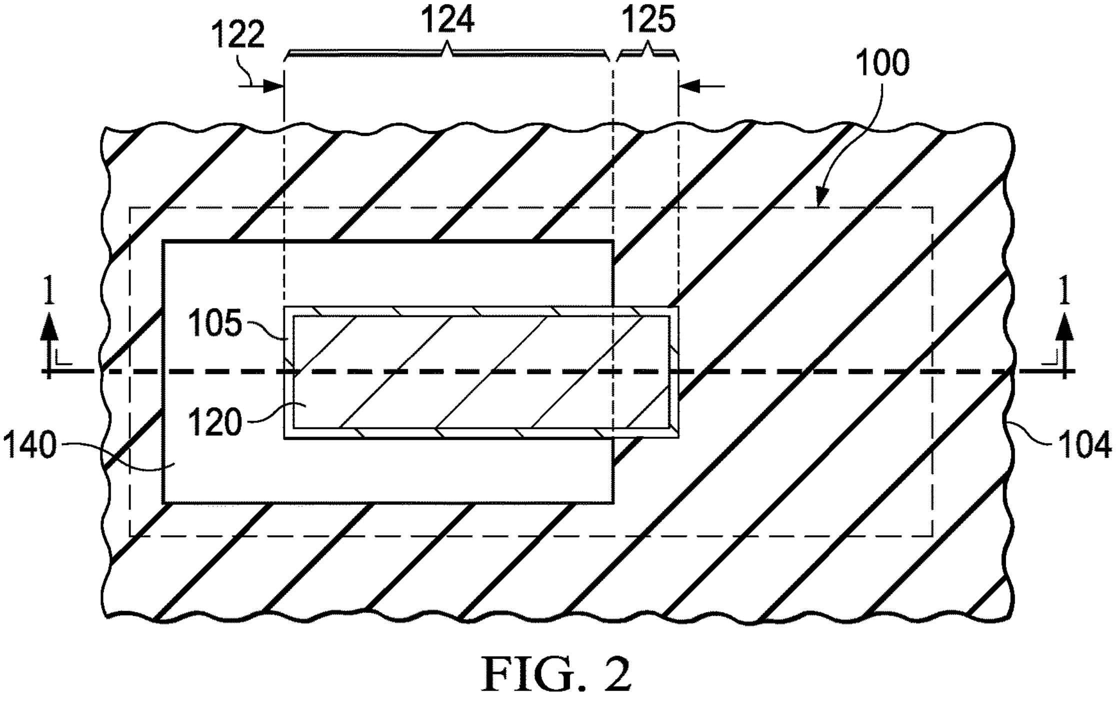
FIG. 2 is a top sectional view of the MEMS device of FIG. 1.

FIG. 1 is a cross-sectional view of a portion of a CMOS integrated circuit chip that includes a MEMS device 100 with a beam 120 formed in a layer of silicon nitride 104. FIG. 2 is top sectional view of the MEMS device of FIG. 1. In this example, beam 120 is part of MEMS device 100. This figure shows the illustration of a simple cantilever beam with two layers. The bottom layer is W 120. This layer is formed using the typical W VIA damascene process flow. VIA pattern with a maximum space for each via but a mesh structure can be used to create large features. SiN etch which may or may not stop on another patterned layer is used to better define the thickness. The trenches are then etched and cleaned to remove resist that is left and any residue that might be present. The next step is depositing a Ti adhesion and barrier layer 105 that is typically CVD TiN (actually TiCON). These barrier materials can be other materials like Ta, TaN, Ru, etc. The trenches are then filled with CVD W and then W outside of the trenches is removed using CMP. The CMP or follow up clean removes the adhesion/barrier layer (Ti/TiN) 105. Since the W needs to be protected from the SiN undercut etch it needs to be protected by materials that are not etched. One technique shown in this figure is to use layer 132 which in this example is Al on TiN. In practice this can be other metals or dielectric materials that are not quickly attacked by the SiN undercut etch process. Example dielectric materials for 132 are AlOx, AlN, SiO2, TaO, TiO2. This layer can be patterned using another mask with etch processes. Another option is to make this a self-aligned protection layer. This process typically starts with a W recess etch (dry or wet) that removes W faster than SiN. A protective insulating or conductive barrier layer is then deposited and then CMP or an etchback process is used to remove the layer above the SiN. In this manner the W is protected without using an additional mask step. A key point is that these materials etch at a much slower rate than the SiN in the undercut etch process.

While this figure shows the creation of a cantilever, in practice multiple patterned and un-patterned layers can be below or above the MEMS layers that have been created using the undercut process. These additional layers may be used to create a wide variety of MEMS devices that can be created using this approach.

In this example, a layer of SiN 104 is formed over a substrate 102, which is this example is silicon (Si). For simplicity, only a small upper portion of substrate 102 is illustrated. As is known, a CMOS process typically fabricates active devices in a thin epitaxial layer of silicon that is formed on top of a bulk wafer of silicon. Also, for simplicity, this example is not drawn to scale. Beam 120 is significantly longer than it is thick. Typical VIA thicknesses 121 are those used in CMOS devices which are typically between 0.1 um to approximately Sum. The total beam thickness in this example is VIA thickness plus any additional layers above layer 132 or below layer 120 (not present in this figure). The released beam length 124 is typically much longer than it is wide with a typical aspect ratio (length to height) of 5 to 1 or even much larger. For example, if the beam is 1 um thick 121, then the released portion 124 of beam 120 is typically much longer than Sum. In other examples, the released portion of such a beam can be longer than 20 um and potentially longer than even 100 um, depending on material and cross-section design. The total length 122 of cantilevered beam feature 120 is always longer than the released beam length 124 so that there is a reasonable length 125 still embedded in remaining SiN 104.

In this example, beam 120 is fabricated from tungsten (W) with a thin liner of TiN. The tungsten and TiN are deposited using a known chemical vapor deposition (CVD) technique in a damascene style process and CMP of the W and TiN are used to remove unwanted metal. The TiN also acts as diffusion barrier and also as an etch protection layer for the W after the SiN has been removed by the undercut etch process. Not shown is a thin layer of Ti which is typically used as an adhesion layer and also used to create a lower resistance electrical connection to metals below this structure. The Ti is typically deposited with directional sputter deposition using ionized metal plasma in order to achieve thin layer of metal on the bottom of the VIA type feature. Damascene is the art of encrusting gold, silver, or copper wire on the surface of iron, steel, bronze, or brass. A narrow undercut is made in the surface of the metal with a chisel and the wire forced into the undercut by means of a hammer. In this example CMOS process, a CMP process is used to remove unwanted tungsten after the CVD process, as described in more detail herein below. This requires a flat surface, so either the surface is un-patterned, or CMP has been used to make it flat prior to the W pattern step. While this is similar to what is done in a CMOS process, in this case the W is surrounded on the bottom and sides by a SiN layer 103 rather than SiO2.

In a damascene process, a dielectric layer is first deposited onto the substrate. The dielectric layer is then patterned and filled by metal deposition. A dual-damascene process is characterized by patterning vias and trenches in such a way that the metal deposition fills both at the same time while leaving interstitial regions between the vias and trenches. The damascene process for beam 120 uses existent interlayer dielectrics in which the vias and trenches for conduction paths are etched. In this case, the dielectric layer 103 is SiN and the metal for beam 120 is tungsten. In another example, the metal for beam 120 may be selected from other metals, such as TiW.

In this example, W or TiW is used to create the MEMS beam structure 120 and provides a low creep rate. Creep in this instance is the change in deflection of the beam after being subjected to time and temperature and possibly added stress. Typical product times/temperatures are 10 yr, 85C, 105C, 125C or 150C. Some products require longer times or even higher temperatures. The stress depends on the application. There is always built in internal stress that might cause the beam to change position even without the added external stress. Many devices require that the beam position (lateral and vertical) not change when not under outside stress. Of course, beams always have a spring constant and do bend under stress. The thickness of the W is selected to provide greater than approximately 75% of the stiffness for beam 120 so a slow creep of other materials does not degrade the properties of the overall MEMS structure. In the example shown, a thin layer 105 of TiN surrounds beam 120, and an aluminum conductor 132 is patterned on top of beam 120. Aluminum is known to have a high creep rate but the overall beam or MEMS structure will not move much if the W has little relative creep and is a dominant fraction of the beams stiffness. In this example, the Al layer can be used not only to protect the top of the W in the beam from the SiN undercut etch but also as an electrical contact to the beam. The Al layer can also be on the bottom of the beam and act as an etch stop for the beam. In various examples, this Al layer also typically includes other materials like Ti, TiAl, TiN. In various examples, other materials may be present as needed for specific functionality.

A sacrificial SiN layer 134 is formed on over SiN layer 104 and various other elements such as Al conductor 132. An SiO2 dielectric layer 136 is formed on top of the SiN layer 134. Opening 138 is patterned in dielectric layer 136 to guide an undercut process. The layer 136 can be multiple layers or even other materials than SiO2, such as AlOx, SiON.

Undercut region 140 is formed using carbon tetrafluoride plus oxygen (CF4+O2) to provide a strong etch rate for SiN while only weakly etching SiO2 etch stop layer 103 and SiO2 top dielectric layer 136. In practice this process needs plasma activated fluorine plus oxygen. There are multiple options for F such as SF6 or other fluorocarbons, plus F2, NF3, HF, etc. For O2 sources there are also multipole options such as H2O, O3, NO2, CO2, etc. The listing of CF4+O2 is a common process that has demonstrated good results but other processes with these alternate chemistries do exist. As illustrated in FIGS. 1 and 2, a portion 141 of undercut region 140 extends across the bottom of a released portion 124 of beam 120 and up the sides of portion 124 of beam 120. A portion 142 of SiN layer 134 is also etched away. Regions 140, 141, 142 together are a cavity region in SiN layer 104, 134 into which a portion of beam 120 is cantilevered. In this manner, the cantilevered released portion 124 of beam 120 is separated from SiN layers 104, 134 and can therefore move in response to a force, such as an electrostatic force. Another portion 125 of beam 120 remains firmly embedded and anchored in SiN layer 104. In this manner the beam 120 can function as part of MEMS device 100.

FIGS. 3A-3F illustrate fabrication steps for MEMS device 100 of FIGS. 1 and 2. An entire wafer 300 that contains tens or hundreds of devices is fabricated as one unit. For simplicity, only a small upper portion of substrate 302 of the wafer 300 is illustrated.

Figure 3A:
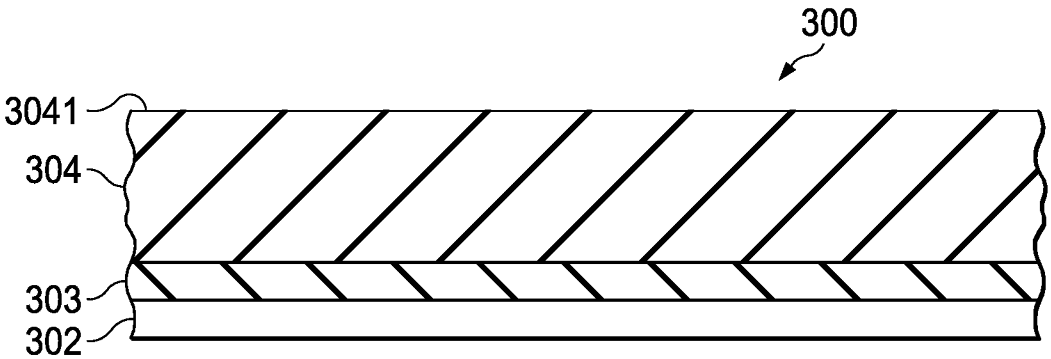
FIGS. 3A-3F illustrate fabrication steps for the MEMS device of FIGS. 1 and 2.

At FIG. 3A, in this example, a layer 303 of SiO2 is formed over a substrate 302, which is this example is silicon (Si). in this example, a CMOS process typically fabricates active devices in a thin epitaxial layer of silicon that is formed on top of a bulk wafer of silicon. SiO2 layer 303 will act as an etch stop during an undercut process. A layer of SiN 304 is then formed over the SiO2 303 layer. SiN layer 304 is thick enough to allow beam 120 (FIG. 2) to be formed within it.

One or more deposition steps may be required to achieve a sufficient thickness of SiN layer 304. The generic term "SiN" for silicon nitride is used herein to refer to any of the various forms of silicon nitride, such as Si3N4, Si(x)N(y) H(z), etc. In this example, the SiN layer has a composition of SiOxNyCz where O is less than 0.1 and C is less than 0.3 and the N makes up the remaining fraction of the material excluding the Si. The hydrogen (H) symbol is typically omitted from the chemical formulas, such as SiN, but is frequently present in many of these materials including metals.

In this example, SiN layer 104 is deposited using a chemical vapor deposition (CVD) process or plasma enhanced chemical vapor deposition (PECVD). Chemical vapor deposition is a coating process that uses thermally induced chemical reactions at the surface of a heated substrate, with reagents supplied in gaseous form. The most common CVD or PECVD silicon nitride typically contains up to 8% hydrogen. Other methods to deposit SiN is sputter deposition or electron evaporation, but this is less common.

After deposition of SiN layer 304 is complete, the wafer surface is typically flattened using a chemical mechanical polishing (CMP) process. This is necessary if there are layers underneath that have introduced topography. The CMP process uses an abrasive and corrosive chemical slurry (commonly a colloid) in conjunction with a polishing pad and retaining ring, typically of a greater diameter than the wafer. The pad and wafer are pressed together by a dynamic polishing head and held in place by a retaining ring. The dynamic polishing head is rotated with different axes of rotation (i.e., not concentric). This removes material and tends to even out any irregular topography, making the top surface 3041 of the wafer flat, also referred to as "planar".

Figure 3B:
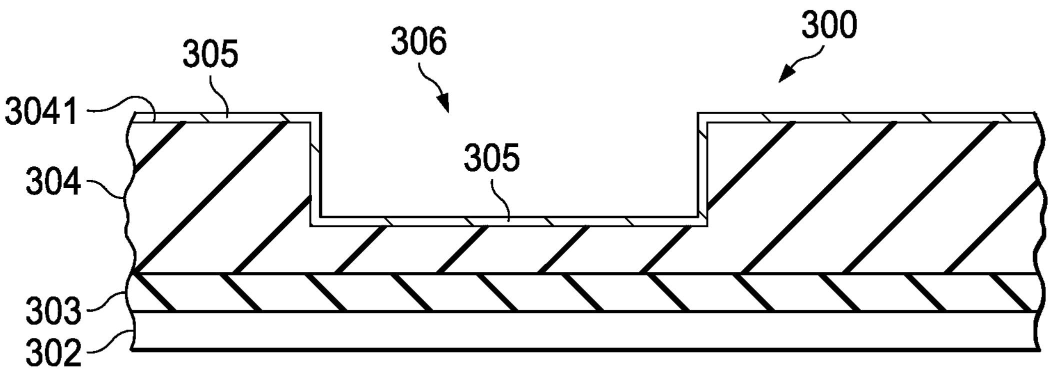

At FIG. 3B, surface 3041 is patterned and etched using a known or later developed etching technique to form trench 306 within SiN layer 304. A thin layer 305 if TiN is then deposited over the wafer. The TiN layer coats the floor and wall of trench 306.

Figure 3C:
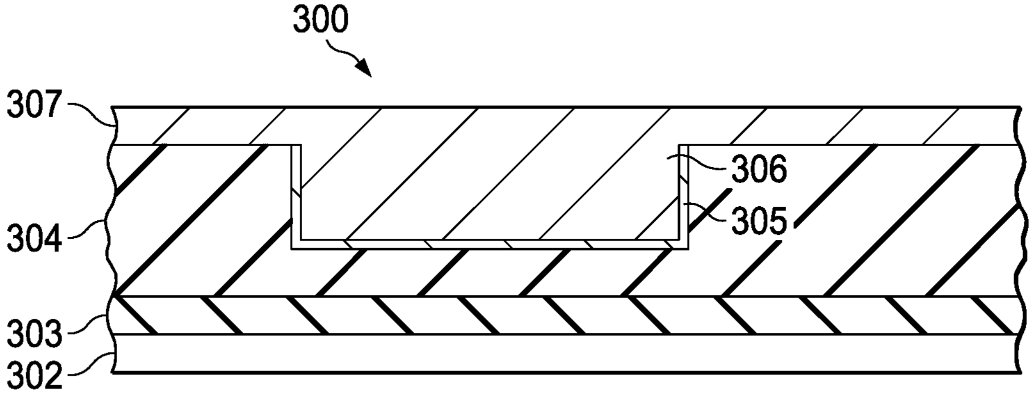

At FIG. 3C, a layer 307 of tungsten is deposited over the surface of the wafer and into cavity 306. Tungsten layer 307 adheres to TiN layer 305.

Figure 3D:
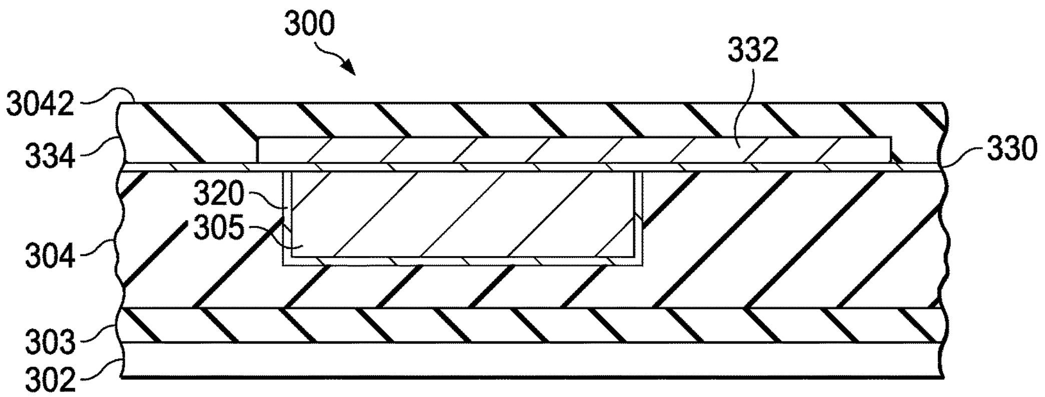

At FIG. 3D, another CMP step has been performed to remove tungsten layer 307 everywhere except within trench 306. In this manner, beam 320 is formed within SiN layer 304. As mentioned above, this is a damascene style process. An alternative to using CMP to remove these layers is an etch-back process.

TiN layer 330 is deposited over the surface of wafer 300. A layer of aluminum is then deposited over the surface of wafer 300. A sacrificial layer (not shown) is then deposited, patterned, and etched to form aluminum conductor 332 that forms a contact for MEMS relay device 100 (FIG. 1).

Another layer 334 of SiN is then deposited over the surface of wafer 300, followed by a CMP process to planarize the surface 3042 of wafer 300.

Figure 3E:
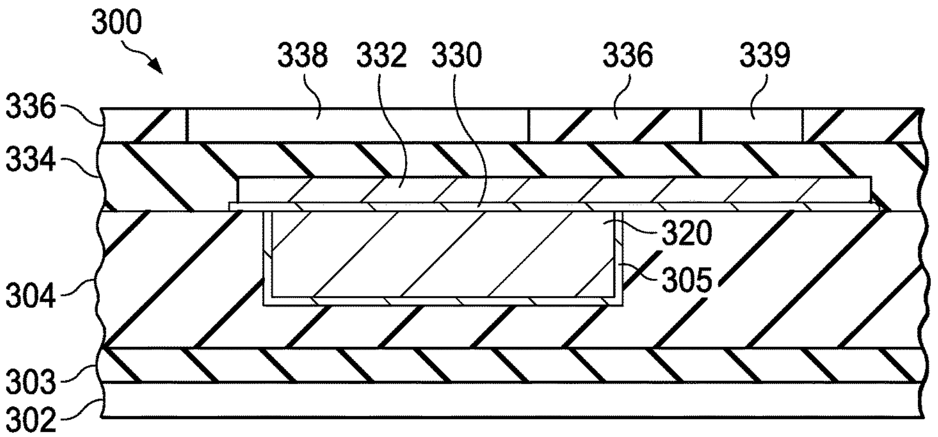

At FIG. 3E, a SiO2 dielectric layer 336 is deposited over the planarized surface of wafer 300. A sacrificial layer (not shown) is then deposited, patterned, and etched to form openings 338 and 339. Opening 338 will guide the undercut process around beam 320. Opening 339 will guide an etch process to form a via to contact to aluminum conductor 332. While only two openings are illustrated for simplicity, other openings are made for various contact points to other features (not shown) on wafer 300.

Figure 3F:
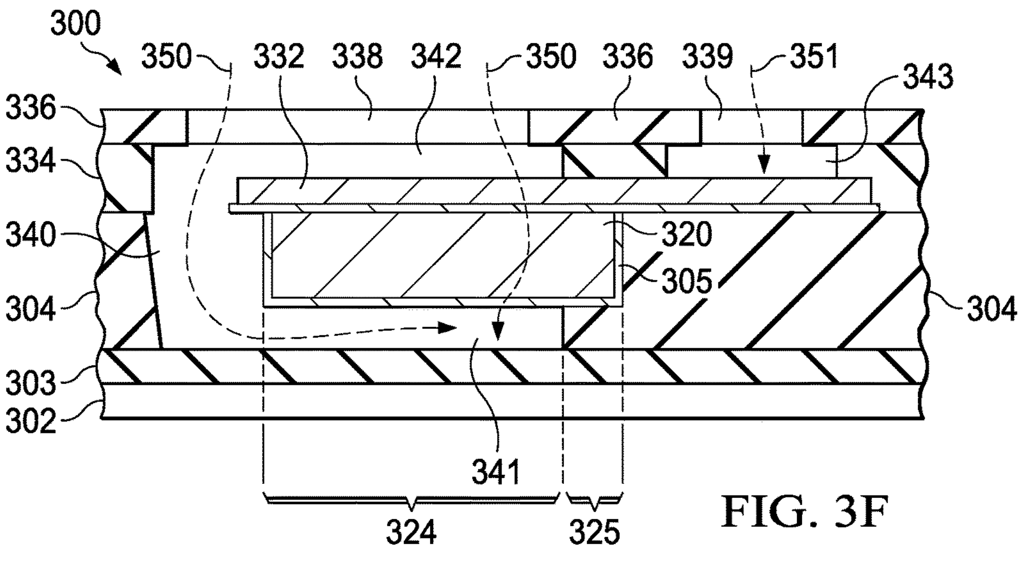

At FIG. 3F, wafer 300 is exposed to a carbon tetrafluoride plus oxygen (CF4+O2) plasma 350, 351 through openings 338, 339 to provide a strong etch rate for SiN layers 304, 334 while only weakly etching SiO2 etch stop layer 303 and SiO2 top dielectric layer 336. In this manner, undercut region 340 and contact region 343 are formed. A portion 341 of undercut region 340 extends across the bottom of a released portion 324 of beam 320 and up the sides of the portion 324 of beam 320. A portion 342 of SiN layer 334 is also etched away. Regions 340, 341, 342 together are a cavity region in SiN layer 304, 334 into which a portion of beam 320 is cantilevered. Released portion 324 of beam 320 is separated from SiN layers 304, 334 to form a released mechanical structure and can therefore move in response to a force, such as an electrostatic force. Another portion 325 of beam 320 remains firmly anchored in SiN layer 304. In this manner, beam 320 can function as part of a resonator or a support beam in a MEMS relay, for example.

While not described herein, various CMOS transistors may also be fabricated on wafer 300 using known or later developed integrated circuit fabrication techniques. Upon completion, wafer 300 is sawn, or otherwise separated, into individual chips, also known as die. The separate die are then attached to a lead frame and encapsulated using a known or later developed IC packaging technique, such as molding with a mold compound, to provide a packaged MEMS device integrated with CMOS circuitry.

Figure 4A:
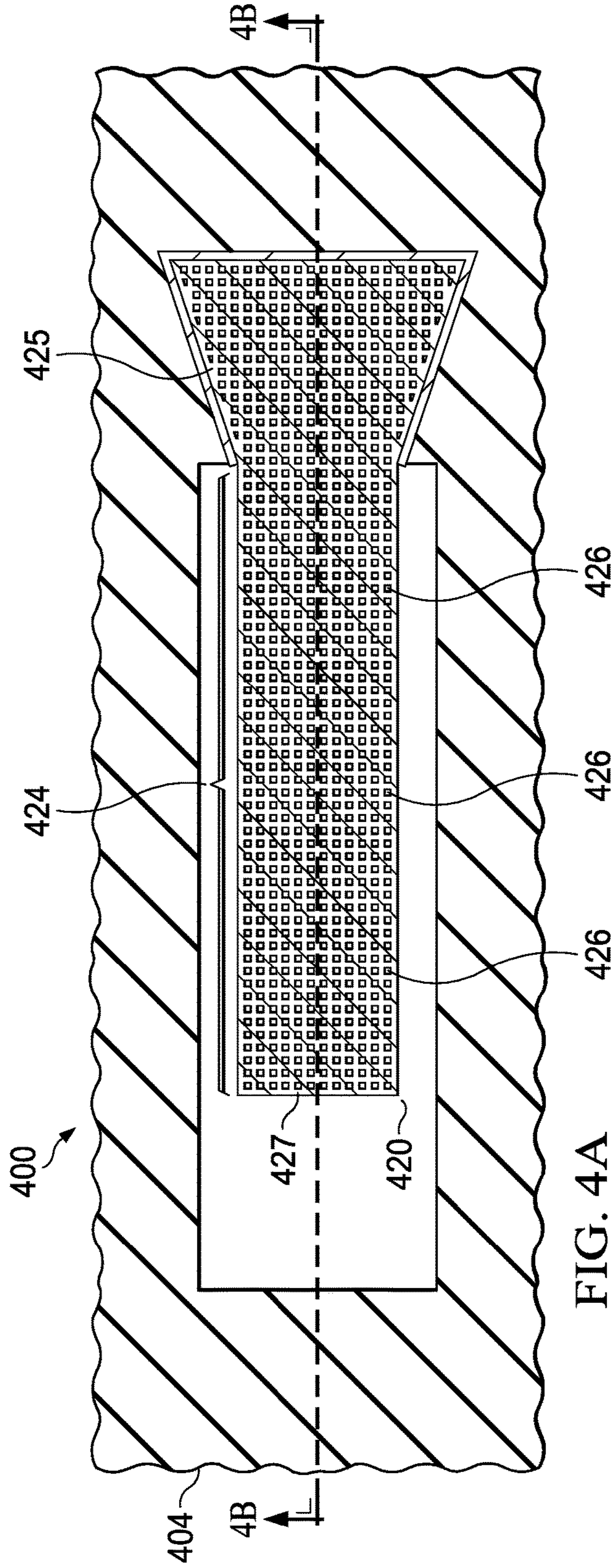
FIG. 4A is a top sectional view and FIG. 4B is a cross sectional view of another example CMOS integrated circuit chip that includes a MEMS device with a beam formed in a layer of silicon nitride.
Figure 4B:
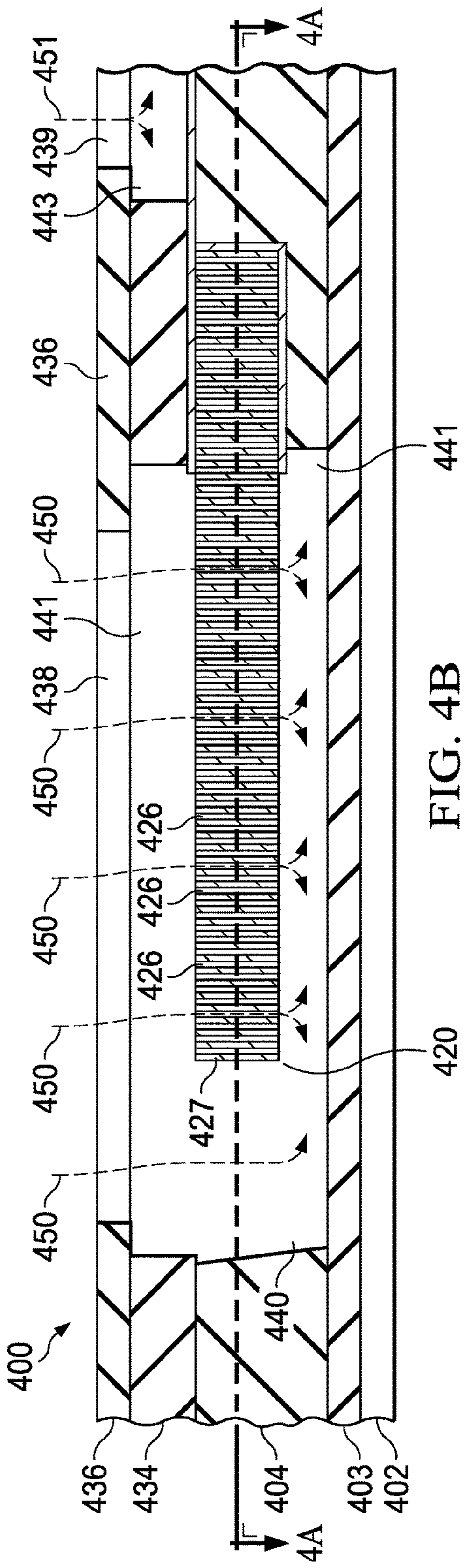

FIG. 4A is a top sectional view and FIG. 4B is a cross sectional view of a portion of another example CMOS integrated circuit chip that includes a MEMS device 400 with a beam 420 formed in a layer(s) 404, 434 of silicon nitride. In this example, beam 420 is fabricated with a matrix of vias and troughs, as indicated in general at 427, etched through a portion 424 of beam 420. The matrix of vias and troughs 427 result in a matrix of interconnected metallic members 427 with interstitial space 426 distributed throughout beam portion 424. Initially, interstitial space 426 will be filled with SiN from SiN remaining from SiN layer 404. In other words, interconnected metallic members 427 of beam portion 424 resemble a waffle pattern.

MEMS device 400 is fabricated in a similar manner as shown in FIGS. 3A-3F with the added steps of fabricating vias 426 and troughs 427. Referring to FIG. 4B, during the plasma etch process described in FIG. 3F, a wafer on which MEMS device 400 is fabricated is exposed to a carbon tetrafluoride plus oxygen (CF4+O2) plasma 450, 451 through openings 438, 439 to provide a strong etch rate for SiN layers 404, 434 while only weakly etching SiO2 etch stop layer 403 on substrate 402 and SiO2 top dielectric layer 436. In another example, it is possible to replace or add other dielectrics like Al2O3 in order to further reduce the etching of the dielectric. In addition, it is possible to use metals that are not strongly attacked by the SiN undercut etch process above or below the MEMS beam as long as SiN is above and below these new structural layers. In this manner, undercut region 440 and contact region 443 are formed. A portion 441 of undercut region 440 extends across the bottom of a portion 424 of beam 420 and up the sides of the portion 424 of beam 420. A portion 442 of SiN layer 434 is also etched away so that portion 424 of beam 420 is separated from SiN layers 404, 434 to form a released mechanical structure and can therefore move in response to a force, such as an electrostatic force. Another portion 425 of beam 420 remains firmly anchored in SiN layer 404. In this manner, beam 420 can function as a MEMS relay.

In this case, plasma etch 450 removes SiN from interstitial space 426 and then diffuses through interstitial space 426 to form portions of undercut region 441. In this manner, an extensive undercut region 441 can be formed under beams that are larger than a what can be formed under a solid beam, such as beam 120 (FIG. 1).

Figure 5:
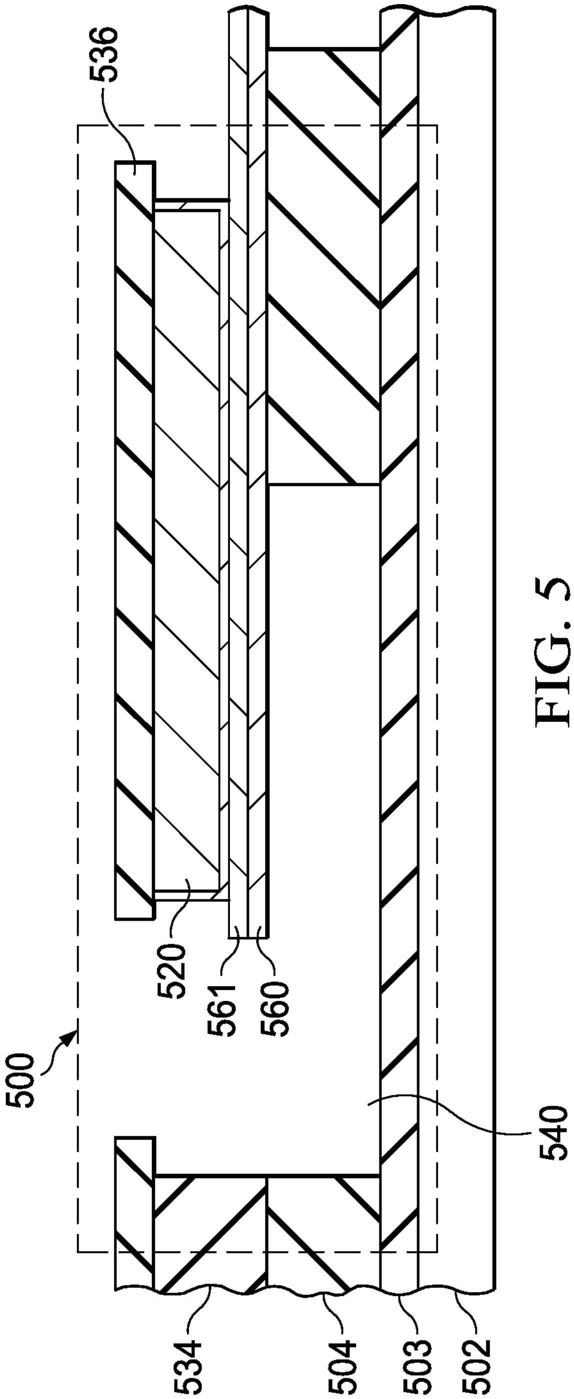
FIG. 5 is a cross sectional view of another example CMOS integrated circuit chip that includes a MEMS device with a beam formed in a layer of silicon nitride.

FIG. 5 is a cross sectional view of a portion of another example CMOS integrated circuit chip that includes a MEMS device 500 with a released mechanical structure 520 formed in a layer(s) of silicon nitride 504, 534 on a silicon substrate 502 In this example the W VIA feature 520, surrounded by CVD TiN 505 on all sides but the top, originally embedded in SiN lands on a patterned metal feature. In this example, the bottom patterned feature contains layer of 560 of iridium (Ir) is positioned on the bottom of beam 520 during the fabrication process. The bottom patterned feature can be made of any material dielectric or metallic that is not strongly attacked by the SiN undercut etch. In this example, the bottom layer is composed of a layer of 561 TiAlN on top of Ir 560. In this example the Ir 560 is on the bottom of a moving MEMS beam 520. This might function as a top contact for a bottom layer that is not shown in this figure to create a relay where the relay is closed when the beam is bent down to make electrical connection to a bottom electrode that is not moving in this example. As discussed earlier, the W is protected from the SiN undercut etch process by SiO2 536 on top of the W. The CVD TiN can protect the W on the sides and on the bottom if necessary. In this case this protective top layer is patterned and etched prior to the SiN undercut process.

In this example, undercut region 540 is fabricated using a plasma of carbon, fluorine, and oxygen (CxFy+O2) to provide selective gas removal of the SiN layers 503, 534 through an opening in dielectric SiO2 layer 536 and yet not attack the Ir layer 560 or etch stop SiO2 layer 503.

Figure 6:
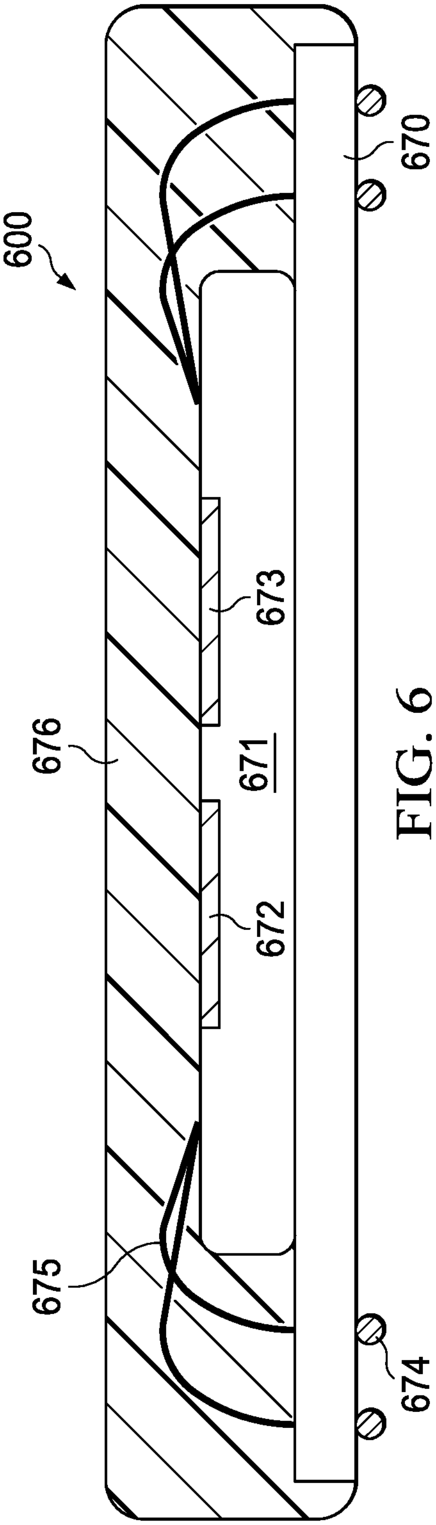
FIG. 6 is an example packaged MEMS device.

FIG. 6 is an example packaged MEMS device 600. In this example, an integrated circuit chip 671 is fabricated using a known or later developed CMOS fabrication technique. CMOS circuitry 672 is formed in IC 671 and includes CMOS transistors, passive devices, and interconnecting conductors. One or more MEMS device 673 is formed in IC 671. MEMS device 673 may be similar to any of devices 100 (FIG. 1), 400 (FIGS. 4A, 4B), 500 (FIG. 5) or other MEMS device fabricated within a SiN layer using a plasma etch process as described in more detail hereinabove.

IC 671 is attached to a lead frame 670 that includes contacts 674. Bond wires 675 connect bond pads on IC 671 to contacts 674 using a known or later developed wire bonding technique.

A mold compound 676 encapsulates IC 671 using a known or later developed encapsulation technique. In this example, completed MEMS device 600 is packaged as a surface mount device.

OTHER EXAMPLES

In described examples, CVD tungsten protected by CVD TiN on 3 sides is used to form a beam structure within SiN. The top side can be protected by another patterned and etched layer or by a self-aligned process like recess the W followed by barrier metal like TiN and more CMP. In other examples, physical vapor deposition (PVD) of titanium, Ta, TiW, TiN, TaN may be used to form a beam structure within SiN, for example. In each case, the use of a carbon, fluorine, and oxygen plasma to undercut the SiN has less impact on other materials. SiN is stronger and has a higher thermal conductivity than SiO2.

SiN undercut etch results in a clean surface where residual carbon or fluorine can be removed using plasma or vapor cleaning process with H2, H2O, O2, N2, NH3, NO, etc.

In described examples, W is used for the low creep material. However, there are other low creep materials, examples of which are included in Table 1. All the materials in Table 1 have extremely high melting temperatures above 1500 C, with most of them having a melting temperature above 2000 C. Materials that are typically used in semiconductor processing that qualify as low creep materials are C, Ta, Mo, Ir, Ru, Ti, and Pd. In addition, there are compounds like TiN or TaN that also qualify as high melting point and low creep materials. Alloys including the commonly used W alloys like TiW and NiW are also high melting temperature and low creep. With a few exceptions, most of the materials listed in Table Tare not typically used in CMOS processing and therefore do not have a well-established materials processing infrastructure of deposition, etch and clean. Most of these materials may be deposited by sputter deposition and hence need to be patterned by pattern and etch process and not the damascene process discussed in described examples. Some of these materials will be etched by an SiN undercut etch process and therefore will need to be protected. This can be done using protective layers at the top and bottom of the stack such as Ta or even a thin layer of SiO2, TiN, Al or AlOx. If necessary, the sides can also be protected by depositing the protective material (CVD TiN, AlOx) followed by etch back process to remove materials on the planar exposed surfaces. One advantage of an etch process to create the beam instead of the damascene process is that a solid beam can be created.

TABLE 1

Example Low Creep Materials

| Melting point | | | Material | | Atomic number |
|---|---|---|---|---|---|
| 1825 K | 1552° C. | 2826° F. | Palladium | Pd | 46 |
| 1933 K | 1660° C. | 3020° F. | Titanium | Ti | 22 |
| 1936 K | 1663° C. | 3025° F. | Lutetium | Lu | 71 |
| 2028 K | 1755° C. | 3191° F. | Thorium | Th | 90 |
| 2045 K | 1772° C. | 3222° F. | Platinum | Pt | 78 |
| 2113 K | 1600° C. | 2912° F. | Protactinium | Pa | 91 |
| 2125 K | 1852° C. | 3366° F. | Zirconium | Zr | 40 |
| 2130 K | 1857° C. | 3375° F. | Chromium | Cr | 24 |
| 2175 K | 1902° C. | 3456° F. | Vanadium | V | 23 |
| 2239 K | 1966° C. | 3571° F. | Rhodium | Rh | 45 |
| 2473 K | 2200° C. | 3992° F. | Technetium | Tc | 43 |
| 2500 K | 2227° C. | 4041° F. | Hafnium | HF | 72 |
| 2523 K | 2250° C. | 4082° F. | Ruthenium | Ru | 44 |
| 2573 K | 2300° C. | 4172° F. | Boron | B | 5 |
| 2716 K | 2443° C. | 4429° F. | Iridium | Ir | 77 |
| 2741 K | 2468° C. | 4474° F. | Niobium | Nb | 41 |
| 2890 K | 2617° C. | 4743° F. | Molybdenum | Mo | 42 |
| 3269 K | 2996° C. | 5425° F. | Tantalum | Ta | 73 |
| 3300 K | 3027° C. | 5481° F. | Osmium | Os | 76 |
| 3453 K | 3180° C. | 5756° F. | Rhenium | Re | 75 |
| 3680 K | 3407° C. | 6165° F. | Tungsten | W | 74 |
| 3773 K | 3500° C. | 6332° F. | Carbon | C | 6 |

In described examples, a simple beam structure that can be used as a relay is described. In described examples, a beam that has a generally rectangular shape is described. In other examples, more complex structures may be formed within SiN using the plasma etch process described herein. These structures can be used in an extremely wide variety of different MEMS structures. A wide variety of materials that are compatible with the plasma etch undercut process can be used to create many types of possible devices. These can be simple structures to create actuators using electrostatic, magnetic, piezoelectric, thermal. The high temperature metals such as Pt, Ir, W, Ru, Mo, Ti can be used to create high temperature heaters which have numerous applications such as gas flow sensors, IR sources. MEMS structures with these can be used to create resonators, IR detectors, heat detectors. Electrical structures such as relays or RF switches with reliable contact materials are possible. Variable capacitor devices can be made using a flexible beam as described herein.

In described examples, a portion of a beam is released from a SiN layer, while another portion remains embedded in the SiN layer. In other examples, a released mechanical structure that has no portion remaining in the SiN layer may be fabricated. In some examples, a released mechanical structure may be supported by a torsion bar or similar support mechanism that is attached to the SiN layer. As used herein, the term "mechanical structure" refers to both fully and partially released structures of various shapes and sizes.

In described examples, a cantilevered beam is positioned within a cavity in a SiN layer. In other examples, the SiN layer may be configured so that it does not completely enclose the cantilevered mechanical structure. For example, there may not be a top layer over the mechanical structure. In another example, a large portion of the SiN layer may be removed, in which case the cantilevered mechanical structure may project from an edge of the SiN layer into essentially open space.

In described examples, the finished packaged devices are surface mount devices with multiple contacts on a bottom side of the package. However, in other examples, the IC package may have any number of known or later developed configurations, and may have various form(s), material(s), shape(s), dimension(s), number(s) of contacts, shape(s) of contacts, etc. Moreover, the MEMS resonator(s) and/or any other components may be packaged, mounted, etc. in the IC package in various configurations. Other examples of IC packages include a wafer-level package and a die-level package.

Many devices are encapsulated with an epoxy plastic that adequately protects the semiconductor devices and has mechanical strength to support the leads and handling of the package. Some integrated circuits have no-lead packages, such as quad-flat no-leads (QFN) and dual-flat no-leads (DFN) devices that physically and electrically couple integrated circuits to printed circuit boards. Flat no-lead devices, also known as micro lead frame (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board. Another example may include packages that are entirely encased in mold compound, such as a dual inline package (DIP).

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A microelectromechanical system (MEMS) device, comprising:
a substrate;
a dielectric layer over the substrate; and
a cantilever beam being suspended over the substrate by the dielectric layer, the cantilever beam having opposing first and second sides and a third side, the third side of the cantilever beam coupled to the dielectric layer, and the first, second and the third side being covered by a layer of material, wherein the cantilever beam includes a matrix of interconnected metallic members.

2. The MEMS device of claim 1, wherein the dielectric layer is a first dielectric layer, and the MEMS device further comprises a second dielectric layer over the substrate opposing the second side of the cantilever beam.

3. The MEMS device of claim 1, wherein the dielectric layer has a composition of SiOxNyCz, where x is less than 0.1, and z is less than 0.3.

4. The MEMS device of claim 1, wherein the cantilever beam has interstitial space distributed throughout the matrix of interconnected metallic members.

5. The MEMS device of claim 4, wherein a portion of the dielectric layer is within a portion of the interstitial space.

6. The MEMS device of claim 1, wherein the material is a first material, the cantilever beam has a fourth side opposing the third side, the fourth side is covered by a layer of a second material that joins the layer of the first material on the first and second sides.

7. The MEMS device of claim 6, wherein the second material includes aluminum.

8. The MEMS device of claim 1, wherein the cantilever beam contains at least one material selected from a group consisting of: titanium (Ti), titanium nitride (TiN), silicon oxide (SiO2), aluminum (Al), titanium aluminum (TiAl), titanium nitride (TiN), titanium tungsten (TiW), nickel (Ni), cobalt (Co), nickel tungsten (NiW), platinum (Pt), iridium (Ir), iridium oxide (IrOx), ruthenium (Ru), ruthenium oxide (RuOx), gold (Au), silver (Ag), lead (Pd), copper (Cu), tantalum (Ta), tantalum nitride (TaN), aluminum nitride (AlN), and aluminum oxide (Al2O3).

9. The MEMS device of claim 1, further comprising at least one of a layer of iridium (Ir) or a layer of titanium aluminum nitride (TiAlN) between the third side of the cantilever beam and the dielectric layer.

10. The MEMS device of claim 1, wherein the dielectric layer includes silicon nitride (SiN).

11. The MEMS device of claim 1, wherein the material includes at least one of: titanium (Ti), tantalum (Ta), or ruthenium (Ru).

12. The MEMS device of claim 1, wherein the cantilever beam has a fourth side opposing the third side, and the dielectric layer covers at least parts of the first, third, and fourth sides of the cantilever beam.

13. An integrated circuit package, comprising:

an integrated circuit (IC) die including circuitry and a microelectromechanical system (MEMS) device coupled to the circuitry, wherein the MEMS device comprises:

a substrate;

a dielectric layer over the substrate; and a cantilever beam being suspended over the substrate by the dielectric layer, the cantilever beam having opposing first and second sides and a third side, the third side of the cantilever beam coupled to the dielectric layer, and the first, second and the third side being covered by a layer of material, wherein the cantilever beam includes a matrix of interconnected metallic members.

14. The integrated circuit package of claim 13, wherein the dielectric layer is a first dielectric layer, and the MEMS device further comprises a second dielectric layer over the substrate opposing the second side of the cantilever beam.

15. The integrated circuit package of claim 13, wherein the dielectric layer has a composition of SiOxNyCz, where x is less than 0.1, and z is less than 0.3.

16. The integrated circuit package of claim 13, wherein the cantilever beam has interstitial space distributed throughout the matrix of interconnected metallic members.

17. The integrated circuit package of claim 16, wherein a portion of the dielectric layer is within a portion of the interstitial space.

18. The integrated circuit package of claim 13, wherein the material is a first material, the cantilever beam has a fourth side opposing the third side, the fourth side is covered by a layer of a second material that joins the layer of the first material on the first and second sides.

19. The integrated circuit package of claim 13, further comprising a mold compound covering the IC die.

* * * * *